United States Patent
Lien et al.

Patent Number: 6,022,776
Date of Patent: Feb. 8, 2000

[54] METHOD OF USING SILICON OXYNITRIDE TO IMPROVE FABRICATING OF DRAM CONTACTS AND LANDING PADS

[75] Inventors: Wan Yih Lien; Kung Linliu, both of Hsinchu; Meng-Jaw Cherng, Hsinchu Hsien, all of Taiwan

[73] Assignee: Worldwide Semiconductor Manufacturing Corporation, Hsinchu, Taiwan

[21] Appl. No.: 09/287,998

[22] Filed: Apr. 7, 1999

[51] Int. Cl.⁷ .................................................. H01L 21/8242
[52] U.S. Cl. ..................... 438/253; 438/381; 438/393; 438/396; 438/257; 257/296; 257/300; 257/306; 257/379
[58] Field of Search .................................. 438/210, 253, 438/381, 393, 396, 257, 239; 257/296, 300, 306, 379, 576

[56] References Cited

U.S. PATENT DOCUMENTS

| | | | |
|---|---|---|---|
| 5,716,881 | 2/1998 | Liang et al. | 438/238 |
| 5,792,687 | 8/1998 | Jeng et al. | 438/253 |
| 5,895,239 | 4/1999 | Jeng et al. | 438/239 |
| 5,930,627 | 7/1999 | Zhou et al. | 438/257 |

*Primary Examiner*—Donald L. Monin, Jr.
*Assistant Examiner*—Hoai Pham
*Attorney, Agent, or Firm*—Blakely Sokoloff Taylor & Zafman

[57] ABSTRACT

A method for forming a DRAM cell of a DRAM circuit is disclosed. The DRAM circuit includes a periphery region and a cell region. The DRAM cell is in the cell region and comprises an access transistor and a capacitor. The access transistor has a gate, a source, and a drain. The periphery region includes a plurality of gates. The method comprises the deposition of a silicon oxynitride layer over the gates, the silicon oxynitride layer acting as a bottom anti-reflection coating. That portion of the silicon oxynitride layer that lies over the DRAM cell is removed. A landing pad is formed over the source of the access transistor and a bitline pad is formed over the drain of the transistor. Next, a first oxide layer is formed over the landing pad and the bitline pad. A capacitor is formed over the landing pad and a second oxide layer is formed over the capacitor. Finally, metal contacts are formed to at least one of the gates in the periphery region using the silicon oxynitride layer as a buffer layer to prevent substrate loss or overetching.

3 Claims, 8 Drawing Sheets

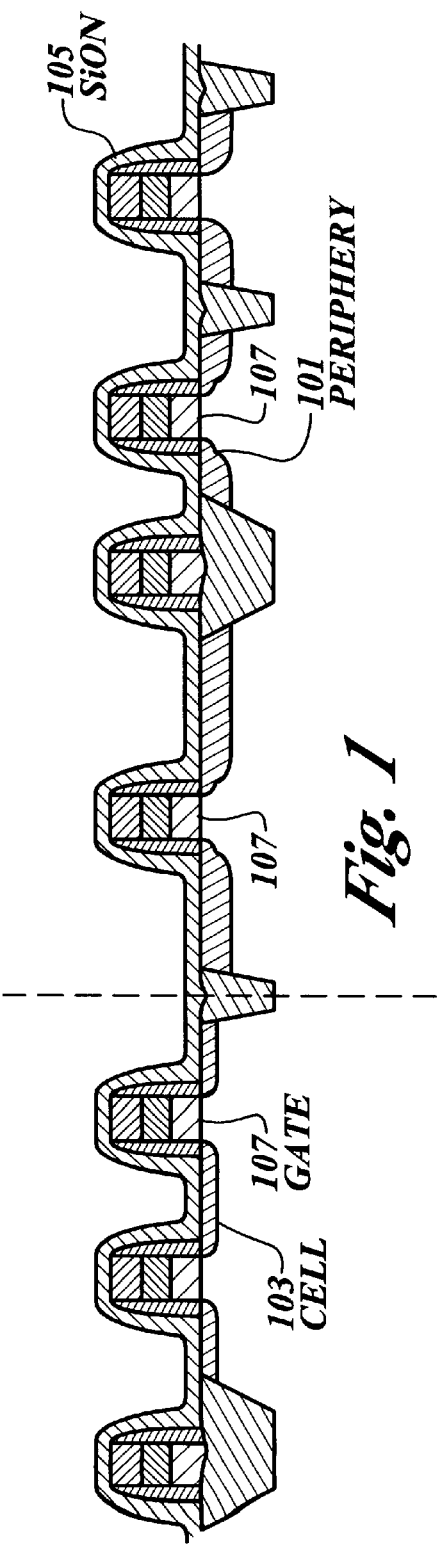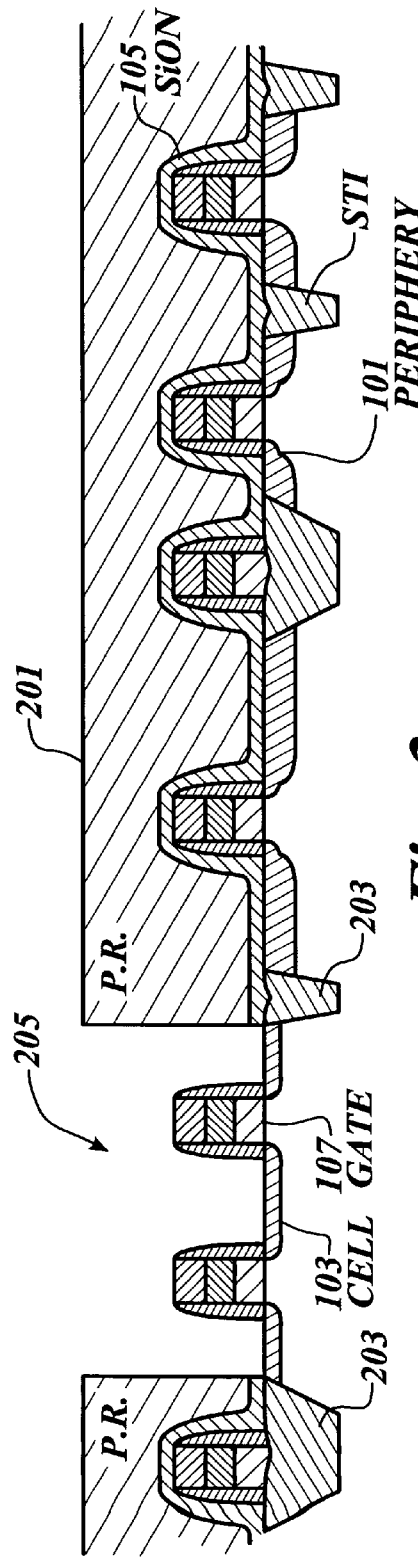

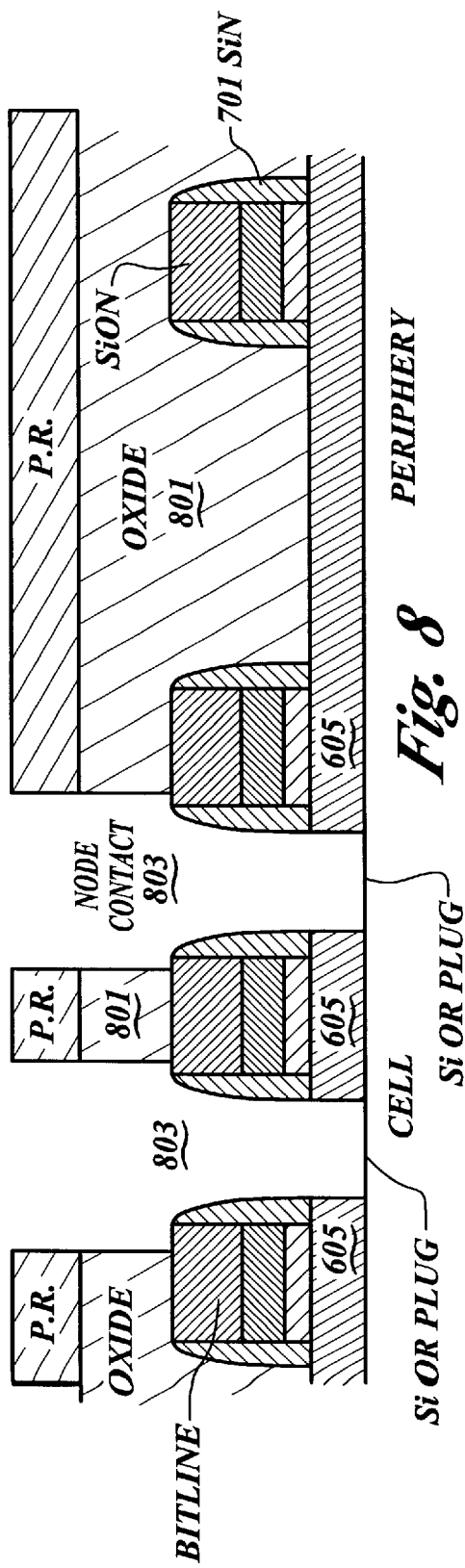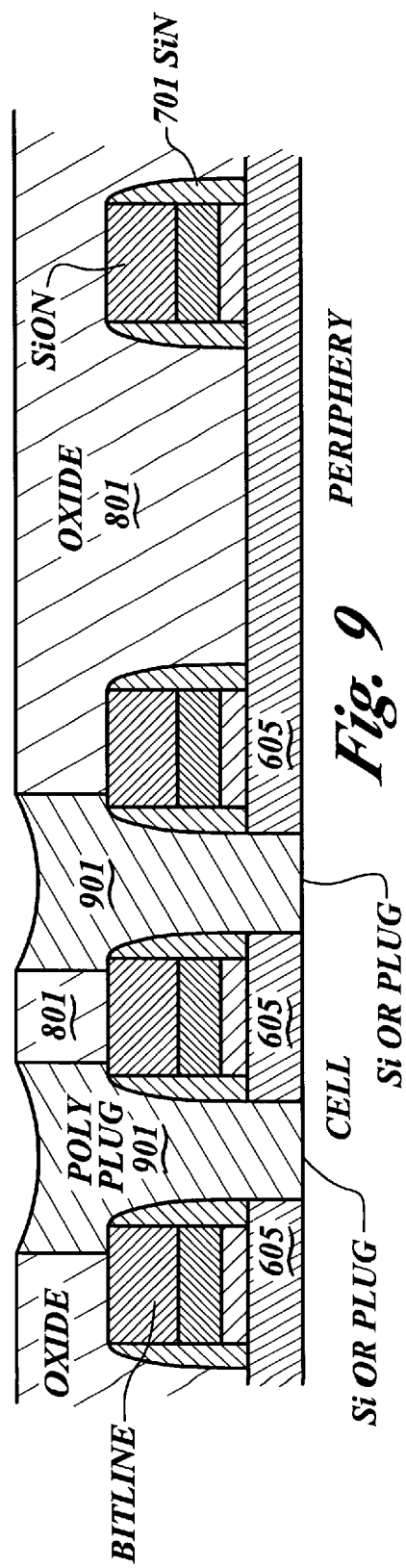

6,022,776

METHOD OF USING SILICON OXYNITRIDE TO IMPROVE FABRICATING OF DRAM CONTACTS AND LANDING PADS

FIELD OF THE INVENTION

The present invention relates to the manufacture of DRAMs, and more particularly, the use of silicon oxynitride to improve the manufacture of landing pads and contacts.

BACKGROUND OF THE INVENTION

It has been a recent trend in dynamic random access memory (DRAM) to increase the density of DRAM circuits. However, as higher density DRAM cells are developed, the area available for capacitors that are used in the DRAM cells decreases. Simply put, the amount of space allotted for a single DRAM cell is becoming smaller and smaller. Several effects arise from this condition. First, in order to achieve desired performance, the capacitance of the capacitor for each DRAM cell must be maintained as large as possible. One common way of achieving this goal is to increase the capacitor node height. The large height of the capacitor node increases the depth of subsequent metal contacts, resulting in a large amount of substrate silicon loss and field oxide damage during the step of etching through the oxide to form the metal contact hole or via.

Another effect is the increase in difficulty in obtaining an acceptable photolithographic pattern. As device dimensions shrink, it is often necessary to use a bottom anti-reflective coating (BARC) to better define the photolithographic pattern. The use of the BARC increases the cost of the process as well as interfering with other process steps, such as opening a landing pad area in the DRAM cell.

The present invention provides a process for simultaneously forming DRAM landing pads, borderless metal contacts, bit line contacts, self-aligned node contacts and capacitor node contacts using silicon oxynitride.

SUMMARY OF THE INVENTION

A method for forming a DRAM cell of a DRAM circuit is disclosed. The DRAM circuit includes a periphery region and a cell region. The DRAM cell is in said cell region and comprised of an access transistor and a capacitor, said access transistor having a gate, a source, and a drain, said periphery region including a plurality of gates. The method comprises the steps of: depositing a silicon oxynitride layer over said gates, said silicon oxynitride layer acting as a bottom anti-reflection coating; removing said silicon oxynitride layer that lies over said DRAM cell; forming a landing pad over said source and a bitline pad over said drain; forming a first oxide layer over said landing pad and said bitline pad; forming a capacitor over said landing pad; forming a second oxide layer over said capacitor; and forming metal contacts to at least one of said plurality of gates in said periphery region using said silicon oxynitride layer as a buffer layer to prevent substrate loss or overetching.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1–5 are cross-sectional views of a semiconductor substrate illustrating the steps of forming a landing pad and contact in accordance with the present invention; and FIGS. 6–11 are cross-sectional views of a semiconductor substrate illustrating an alternative embodiment of the present invention.

DETAILED DESCRIPTION OF THE PREFERRED EMBODIMENT

Figure 3:
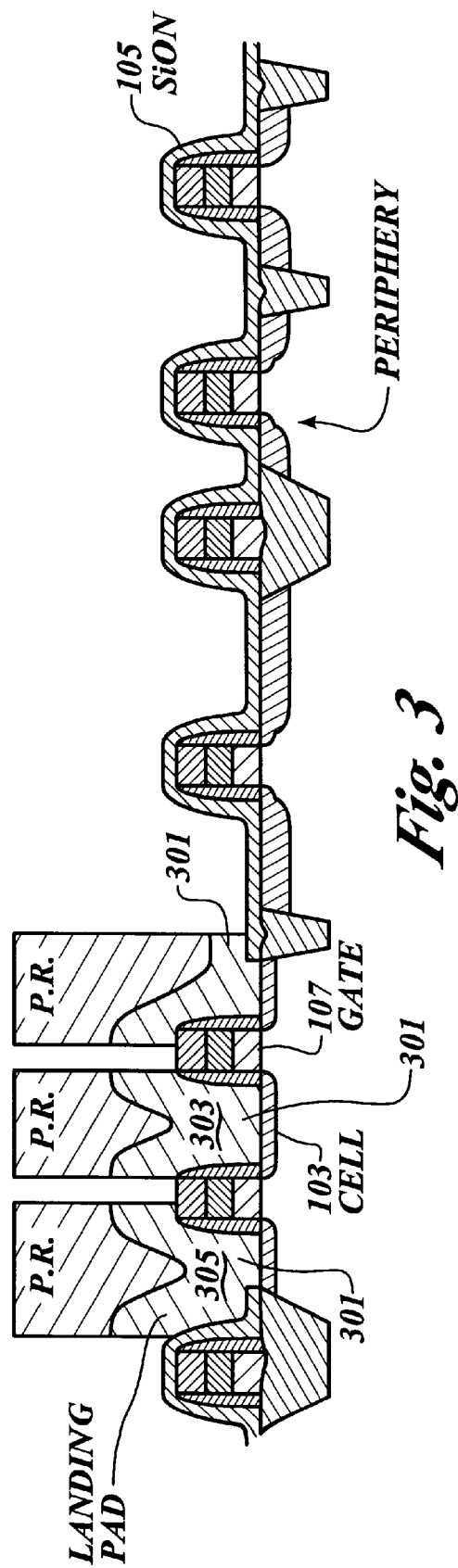

FIG. 1 shows a typical cross-sectional view of a DRAM memory device. The DRAM memory device includes a periphery region 101 and a cell region 103 (showing a single DRAM cell). As is well known in the prior art, the structure of the cell region 103 and the periphery region 101 is of conventional design and includes a plurality of transistors having sidewall spacers and various implant regions.

However, departing from the prior art, the present invention teaches the deposition of a silicon oxynitride layer 105. The silicon oxynitride layer 105 is blanket deposited over the cell region 103 and the periphery region 101 atop the gate structures 107. Preferably, the silicon oxynitride layer 105 is between 200 and 500 angstroms thick.

Next, turning to FIG. 2, a photoresist layer is deposited and patterned onto the silicon oxynitride layer 105. The photoresist layer 201 is patterned so that the cell region 103 is exposed to etching whereas the periphery region 101 is covered. Therefore, the silicon oxynitride layer 105 that is over the gate 107 of the cell 103 is removed. Note also that shallow trench isolation structures 203 are used to electrically isolate the DRAM cell 103. The opening to the cell 103 is referred to as a landing pad opening 205. Note that the silicon oxynitride layer 105 is advantageously used as a bottom anti-reflective coating to improve photolithography.

Next, turning to FIG. 3, a layer of insitu doped polysilicon is deposited over the entire surface after the photoresist layer 201 has been stripped. Preferably, the polysilicon layer 301 is on the order of 1,000 to 3,000 angstroms thick. After the polysilicon layer 301 is blanket deposited, using conventional photolithography techniques, those portions of the polysilicon layer 301 that lie outside the cell 103 are removed. The silicon oxynitride layer 105 is used as an etching stop. In addition, the landing pad of a bit line contact 303 is defined by the photolithography pattern. Similarly, the landing pad of a capacitor node contact 305 is defined by the same photolithography pattern.

Figure 4:
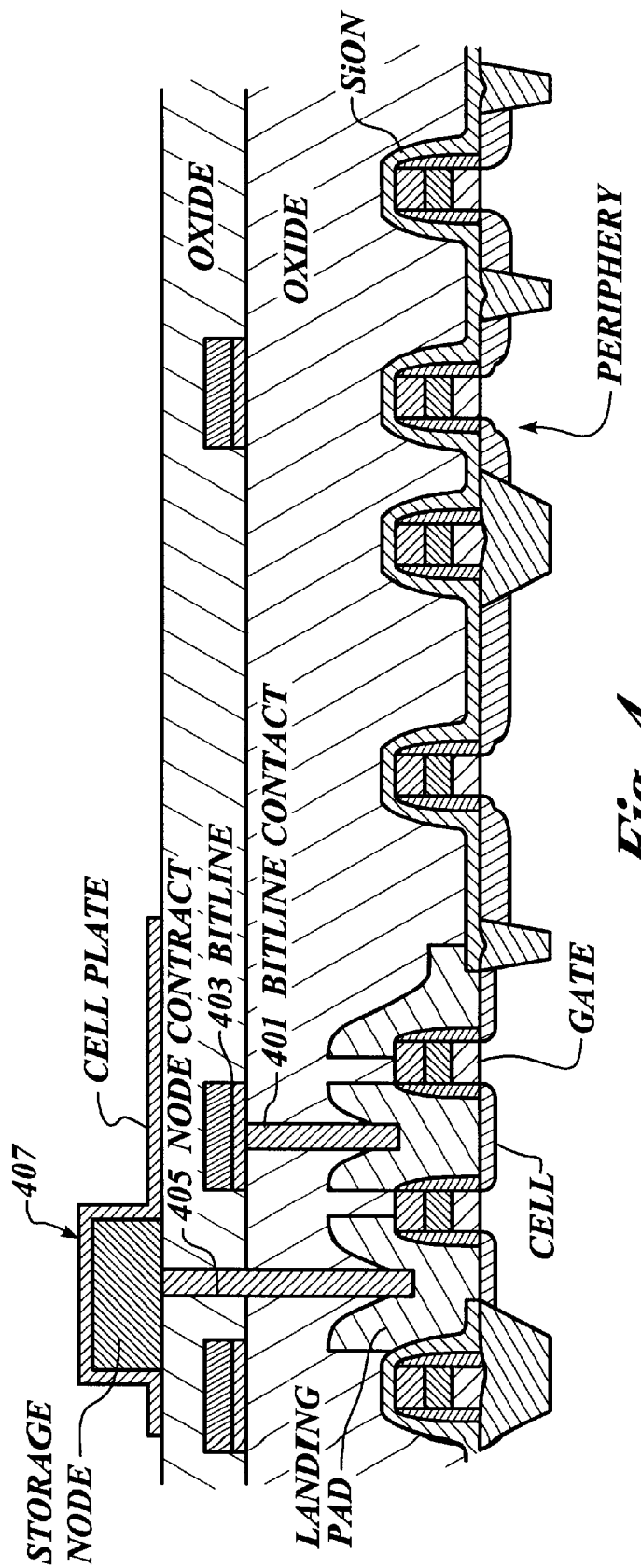
Figure 5:
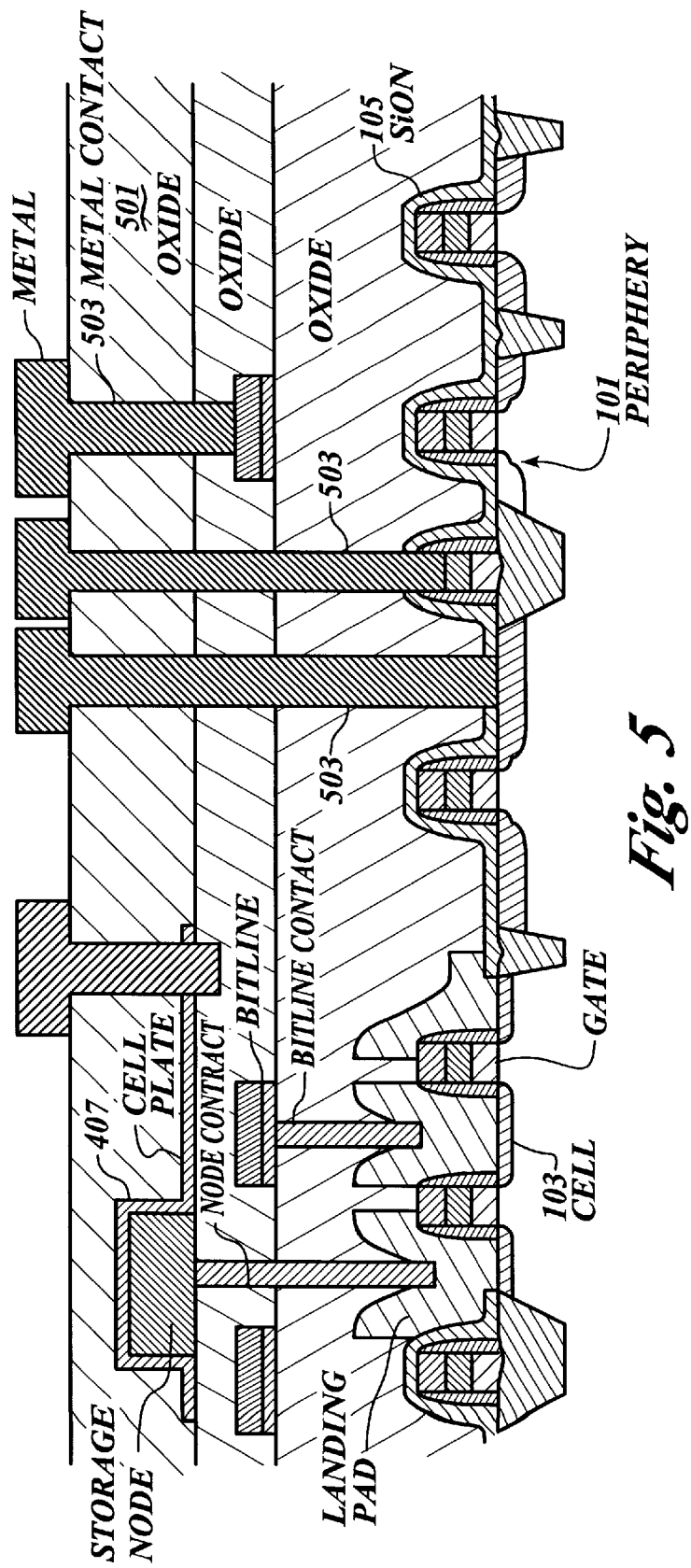

Turning next to FIG. 4, conventional process steps, as in the prior art, are used to form a bit line contact 401, the bit line 403, a node contact 405, and the capacitor 407. Turning to FIG. 5, an interlayer dielectric 501 is deposited over the capacitor 407. Typically, the deposition of the interlayer dielectric 501 requires a planarization step, for example, chemical mechanical planarization (CMP) to equalize the step height between the cell 103 and the periphery region 101. Next, metal contacts 503 are etched through the oxide 501 to reach the underlying electrically active components in the peripheral region 101. Note that because of the presence of the silicon oxynitride layer 105 overlying the active devices in the periphery 101, a buffering effect for the deep metal contact oxide etching is obtained. This buffering effect reduces substrate silicon loss and field oxide damage. The reduced field oxide damage makes a borderless metal contact easily available.

Figure 6:
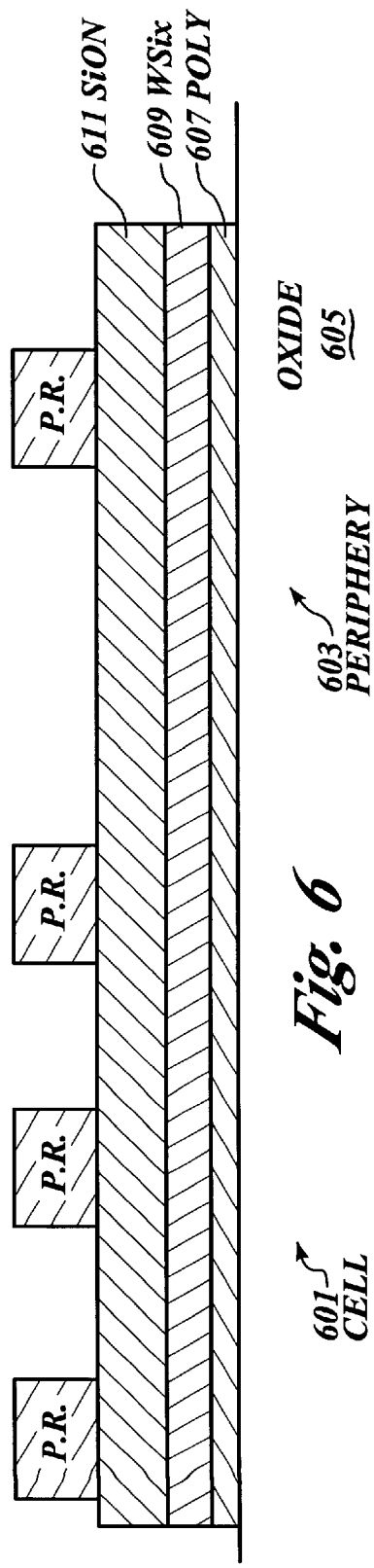

Use of the silicon oxynitride layer can further be extended to the manufacturer of other components in the DRAM product. For example, turning to FIG. 6, a cross section of a DRAM product is shown. The cross section includes a cell region 601 and a periphery region 603. The cross section of FIG. 6 is of the upper layers of the DRAM circuit. In particular, an interlayer dielectric oxide 605 is shown as the bottom-most layer. Formed atop the interlayer dielectric layer 605 is a polysilicon layer 607 that is preferably between 500 and 1500 angstroms thick. Formed above the polysilicon layer 607 is a tungsten silicide layer 609 that is formed to about 1,000 to 2,000 angstroms thick. Formed atop the tungsten silicide layer 609 is a silicon oxynitride layer 611. Preferably, the silicon oxynitride layer 611 is between 1,000 and 1,500 angstroms thick. The silicon oxynitride layer 611 is used as a bottom anti-reflective coating to aid in the definition of the bit line pattern.

Figure 7:
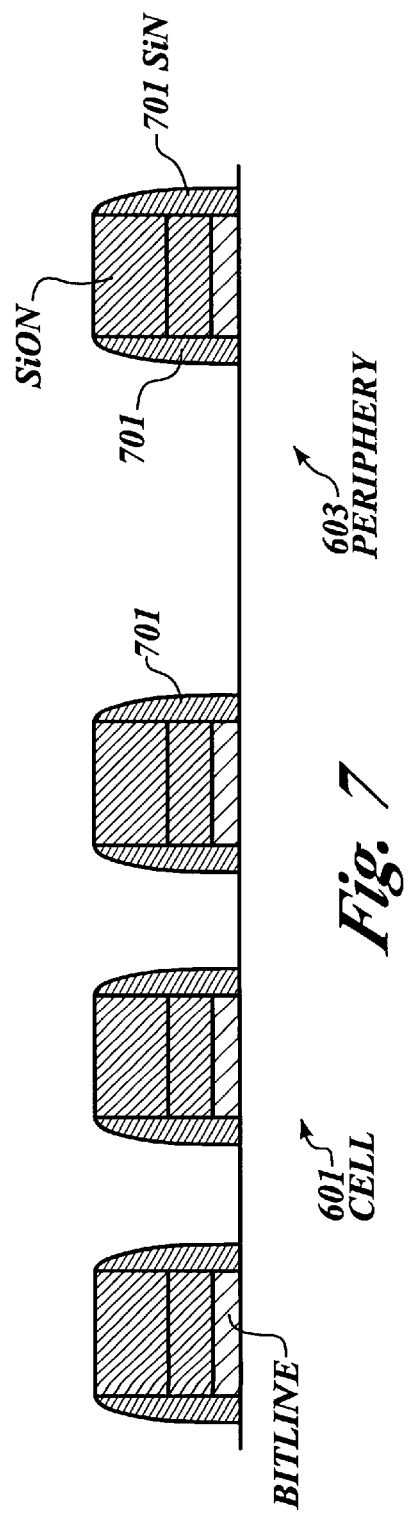

Additionally, using conventional photolithography techniques, the bit line pattern is etched to result in the pattern of FIG. 7. FIG. 7 also shows the formation of silicon nitride spacers 701 along the sidewalls of the bit line pattern using conventional methods. Next, turning to FIG. 8, a further interlayer dielectric 801 is preferably formed from silicon dioxide, and more preferably formed from BPSG having a thickness of 3,000 to 6,000 angstroms. The use of BPSG is preferred to achieve local planarization over the bit line pattern. Alternatively, USG silicon dioxide may be deposited using a high density plasma process to obtain the capability for narrow bit line spacing in deep submicron DRAM products followed by CMP planarization.

In any event, after the deposition of the interlayer dielectric layer 801, self-aligned node contacts 803 are formed using conventional photolithography techniques using a high etching selectivity for silicon dioxide versus silicon nitride and silicon oxynitride. For example, the following etching recipe may be used: pressure 30–50 millitorr, power 1200–1800 watts, flow of $C_4F_8$ at 5–9 sccm, flow of Ar at 400–600 sccm, and flow of $CH_2F_2$ at 3–5 sccm. Note that in FIG. 8, the underlying oxide layer 605 is etched through until either the silicon substrate is reached or a contact plug is reached.

Next, turning to FIG. 9, a polysilicon layer of between 3,000 to 5,000 angstroms is blanket deposited over the oxide layer 801. The polysilicon layer is then etched back to form polysilicon plugs 901.

Figure 10:
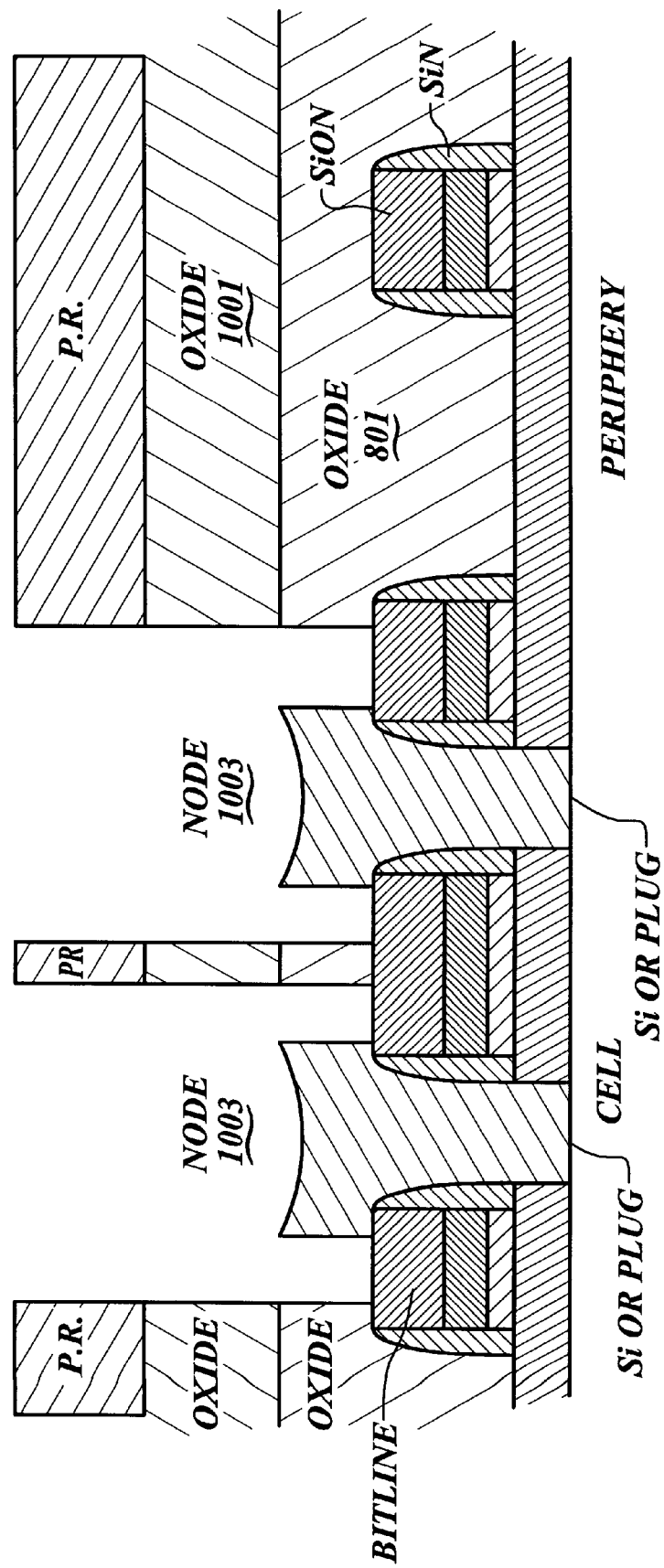
Figure 11:
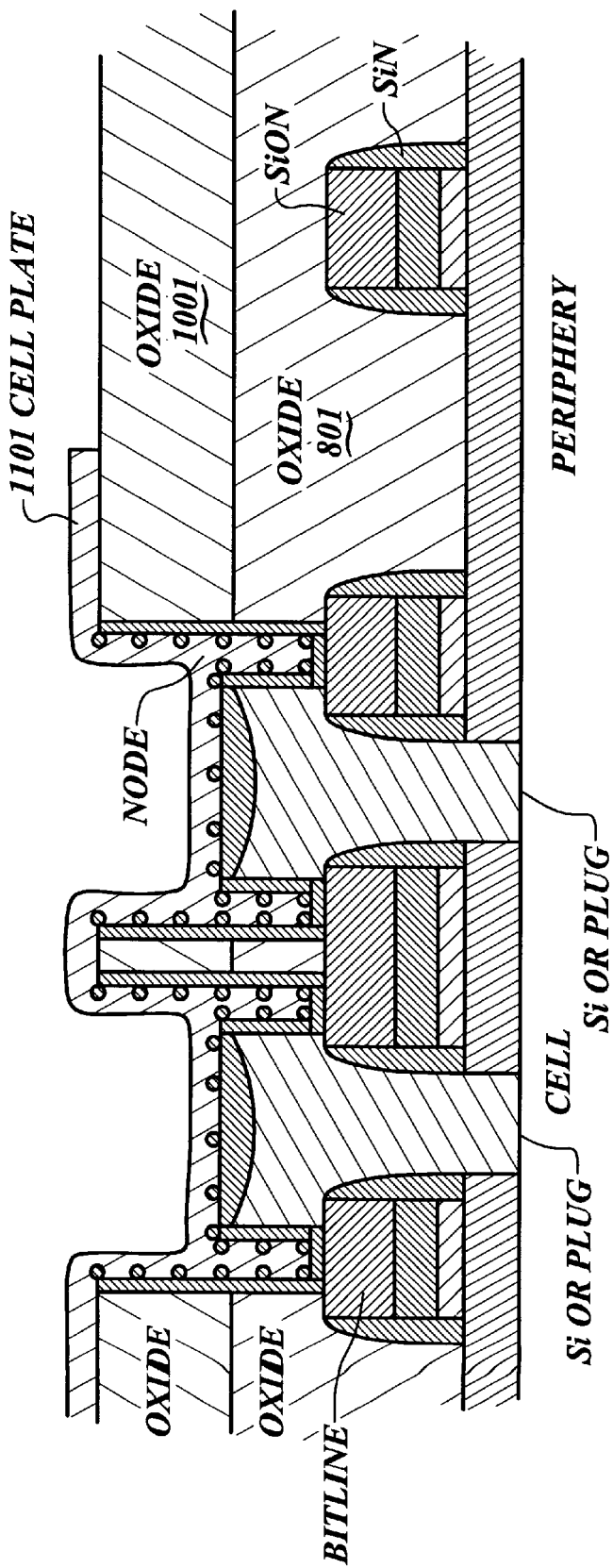

Next, turning to FIG. 10, a further oxide layer 1001 is deposited to a thickness of between 10,000 and 20,000 angstroms. The oxide layer 1001 is patterned using conventional photolithography techniques to form capacitor openings 1003. The etching of the oxide layer 1001 can be controlled to stop on the silicon oxynitride layer by using a high selectivity silicon oxide versus silicon oxynitride etching process (as detailed above). Turning next to FIG. 11, a capacitor bottom plate, dielectric, and top cell plate 1101 are formed into the capacitor openings to complete the formation of the capacitor.

The foregoing process again showed the use of silicon oxynitride as a bottom anti-reflective coating for improving the definition of the bit line pattern. In addition, the silicon oxynitride layer is also used to form a self-aligned node contact and an etching stop layer for high step height capacitor oxide etch.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a DRAM cell of a DRAM circuit, said DRAM circuit including a periphery region and a cell region, said DRAM cell being in said cell region and comprised of an access transistor and a capacitor, said access transistor having a gate, a source, and a drain, said periphery region including a plurality of gates, the method comprising the steps of:

depositing a silicon oxynitride layer over said gates, said silicon oxynitride layer acting as a bottom anti-reflection coating and directly in contact with said gates;

removing said silicon oxynitride layer that lies over said DRAM cell;

forming a landing pad over said source and a bitline pad over said drain; forming a first oxide layer over said landing pad and said bitline pad;

forming a capacitor over said landing pad;

forming a second oxide layer over said capacitor; and forming metal contacts to at least on of said plurality of gates in said periphery region using said silicon oxynitride layer as a buffer layer to prevent substrate loss or overetching.

2. The method of claim 1 further including planarizing said second oxide layer prior to forming said metal contacts.

3. A method of forming a capacitor node for a DRAM cell, the method comprising:

depositing a polysilicon layer on a substrate;

depositing a tungsten silicide layer on said polysilicon layer;

depositing a silicon oxynitride layer directly over and in contact with said tungsten silicide layer;

patterning and etching said polysilicon layer, said tungsten silicide layer and said silicon oxynitride layer to form a gate stack;

forming silicon nitride sidewall spacers on said gate stack;

forming an oxide layer over said gate stack;

forming at least one polysilicon plug in said oxide layer adjacent to said gate stack; and forming a bottom storage node for said capacitor atop said polysilicon plug.

* * * * *